(12) United States Patent
Chang

(10) Patent No.: US 11,876,289 B2
(45) Date of Patent: Jan. 16, 2024

(54) SINGLE ANTENNA WITH A SHARED RADIATOR

(71) Applicant: NANJING SILERGY MICRO (HK) CO., LIMITED, Causeway Bay (HK)

(72) Inventor: Chia-Lin Chang, Causeway Bay (HK)

(73) Assignee: NANJING SILERGY MICRO (HK) CO., LIMITED, Causeway Bay (HK)

( * ) Notice: Subject to any disclaimer, the term of this patent is extended or adjusted under 35 U.S.C. 154(b) by 73 days.

(21) Appl. No.: 17/396,821

(22) Filed: Aug. 9, 2021

(65) Prior Publication Data

US 2022/0069451 A1 Mar. 3, 2022

(30) Foreign Application Priority Data

Aug. 25, 2020 (CN) .......................... 202010863299.9

(51) Int. Cl.
*H01Q 1/36* (2006.01)
*H01Q 5/335* (2015.01)
*H01Q 5/328* (2015.01)

(52) U.S. Cl.
CPC .............. *H01Q 1/36* (2013.01); *H01Q 5/328* (2015.01); *H01Q 5/335* (2015.01)

(58) Field of Classification Search
CPC ........... H01Q 1/36; H01Q 5/328; H01Q 5/335
USPC ........................................................ 343/850
See application file for complete search history.

(56) References Cited

U.S. PATENT DOCUMENTS

| 8,963,784 | B2 * | 2/2015 | Zhu | H01Q 9/30 343/702 |
| 9,041,619 | B2 * | 5/2015 | McMilin | H01Q 5/314 343/904 |
| 9,231,293 | B2 * | 1/2016 | Park | H01Q 1/44 |
| 2013/0265201 | A1 * | 10/2013 | Kanj | H01Q 9/0421 343/700 MS |
| 2016/0248146 | A1 * | 8/2016 | Wang | H01Q 1/48 |
| 2021/0351509 | A1 * | 11/2021 | Lin | H01Q 5/328 |

FOREIGN PATENT DOCUMENTS

| CN | 101685906 A | * | 3/2010 |
| CN | 104600417 A | * | 5/2015 |
| CN | 105591192 A | * | 5/2016 |
| CN | 107834205 A | * | 3/2018 |
| CN | 110137681 A | * | 8/2019 |
| JP | 2004236273 A | * | 8/2004 |

* cited by examiner

*Primary Examiner* — Ricardo I Magallanes
*Assistant Examiner* — Brandon Sean Woods
(74) *Attorney, Agent, or Firm* — Amin, Turocy & Watson, LLP

(57) ABSTRACT

A single antenna with a shared radiator includes a radiator unit, a feed-in unit, a sensing module and a ground unit. The feed-in unit is coupled with the radiator unit and used to send or receive radio frequency signals together with the radiator unit. The sensing module is connected to the radiator unit and used for sensing a distance between the radiator unit and an object by the radiator unit. A distributed capacitor structure is formed between the ground unit and the radiator unit.

6 Claims, 3 Drawing Sheets

SINGLE ANTENNA WITH A SHARED RADIATOR

RELATED APPLICATIONS

The present application claims the priority of Chinese Application No. 202010863299.9, filed Aug. 25, 2020, the disclosure of which is hereby incorporated by reference herein in its entirety.

BACKGROUND OF THE INVENTION

1. Field of the Invention

The present disclosure generally relates to a single antenna with a shared radiator, and, more particularly, to a single antenna with a shared radiator used in specific absorption rate (SAR) test.

2. Description of the Related Art

In general, in order to prevent the electromagnetic waves generated by communication electronic products such as mobile phones or tablet computers from affecting human health, these electronic products need to pass the SAR test. In the prior art, a sensing module is electrically connected to an antenna of the electronic product to detect the distance between the antenna and the human body. Then adjusting the output power of the radio frequency signal according to the distance to meet the requirement of the SAR test specifications. The radio frequency signal used for communication is a high frequency signal. On the other hand, the sensing module determines the distance by detecting the change in a capacitance of the antenna radiator, which is a low-frequency signal. Therefore, it is necessary to add a capacitor between the antenna radiator and the ground plane to isolate or separate the high and low frequency signals to avoid mutual interference.

However, the capacitor used in the prior art is generally a ceramic capacitor. The capacitance value of the ceramic capacitor varies according to the operating frequency of the antenna which is about dozens of pF. It is close to the upper limit of the detectable capacitance value of the sensing module. Consequently, the capacitor will affect the distance detection capability of the sensing module, so that the maximum distance that can be sensed is reduced. Therefore, how to provide a single antenna with a shared radiator which can separate the high and low frequency signals without affecting the distance detection capability, which has become an urgent problem to be solved in the industry.

SUMMARY OF THE INVENTION

In order to solve the aforementioned problems in the prior art, an object of the present invention is to provide a single antenna with a shared radiator that can isolate high and low frequency signals without affecting the distance detection capability.

In light of solving the foregoing problems of the prior art, the present invention provides a single antenna with a shared radiator comprising a radiator unit, a feed-in unit, a sensing module and a ground unit.

The feed-in unit is coupled with the radiator unit and used to send or receive radio frequency signals together with the radiator unit. The sensing module is connected to the radiator unit and used for sensing a distance between the radiator unit and an external object through the radiator unit. The ground unit forms a distributed capacitor structure between the ground unit and the radiator unit.

In an embodiment, the single antenna with a shared radiator according to the present invention further comprising a radio frequency signal module. The radio frequency signal module is connected to the feed-in unit and used to generate or receive the radio frequency signals.

In an embodiment, the sensing module is further used to generate a distance signal according to the distance from the external object, and the radio frequency signal module is further used to adjust an output power of the radio frequency signal according to the distance signal.

In an embodiment, the feed-in unit is a loop antenna, monopole antenna or PIFA antenna.

In an embodiment, the distributed capacitor structure is a single-layer capacitor structure, a double-layer capacitor structure or an interdigitated capacitor structure.

In an embodiment, the single antenna with a shared radiator according to the present invention further comprising a connecting capacitor. Wherein, one end of the connecting capacitor is connected to the radiator unit and the other end is connected to the feed-in unit.

Compared to the prior art, a distributed capacitor structure can be formed between a ground unit and a radiator unit in the single antenna with a shared radiator according to the present invention. The single antenna with a shared radiator can separate the high and low frequency signals. Since the length or area of the conductor of the distributed capacitor structure at the end near the radiator unit is much smaller than the length or area of the conductor of the distributed capacitor structure at the end near the ground unit, the electric charges would be difficult to store. Consequently, the capacitance value of the distributed capacitor structure would be very small and would not affect the distance sensing capability of the sensing module. The problems in the prior art are sufficiently solved.

DETAILED DESCRIPTION

Figure 1:
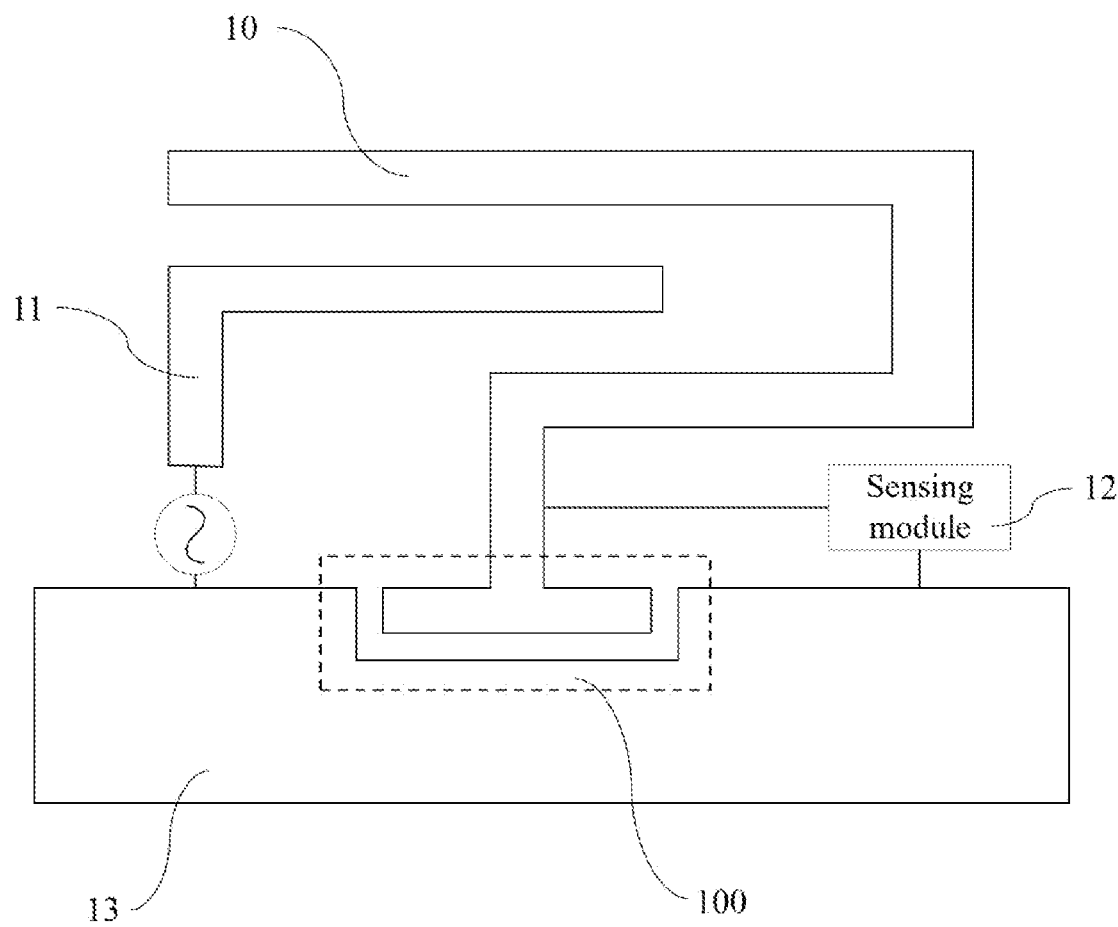
FIG. 1 illustrates a schematic view of a structure of the single antenna with a shared radiator according to a first embodiment of the present invention.

The present invention is described by the following specific embodiments. Those with ordinary skills in the arts can readily understand other advantages and functions of the present invention after reading the disclosure of this specification. Any changes or adjustments made to their relative relationships, without modifying the substantial technical contents, are also to be construed as within the range implementable by the present invention.

It should be noted that the structure, ratio, size, etc. shown in the drawings in this specification are only used to match the content disclosed in the specification for the understanding and reading of those who are familiar with the art, and are not intended to limit the implementation of the present invention. Therefore, it has no technical significance, any structural modification, proportion change or size adjustment shall fall under the present invention without affecting the effects and objectives that can be achieved by the present invention, the disclosed technical content must be within the scope of coverage. At the same time, the terms such as "upper", "inner", "outer", "bottom" and "one" cited in this specification are only for ease of description, not to limit the implementation scope of the present invention, the relative changes or adjustments, without substantial changes to the technical content, shall be regarded as the scope of the present invention, and shall be described first.

Please refer to FIG. 1. FIG. 1 illustrates a schematic view of a structure of the single antenna with a shared radiator according to a first embodiment of the present invention. As shown in the figure, the single antenna with a shared radiator according to the present invention includes a radiator unit 10, a feed-in unit 11, a sensing module 12 and a ground unit 13.

In an embodiment, the feed-in unit 11 is coupled with the radiator unit 10 and used to send or receive radio frequency signals together with the radiator unit 10. For example, the radio frequency signal can be an electromagnetic wave signal having frequencies of 2.4 GHz or 5 GHz under the IEEE 802.11 standard, but not limited thereto. In addition, the size or shape of the feed-in unit 11 and the radiator unit 10 can be adjusted in order to receive radio frequency signals of different frequency bands.

In an embodiment, the sensing module 12 is connected to the radiator unit 10 and used for sensing a distance between the radiator unit 10 and an object (e.g. human body) by the radiator unit 10. When the object approaches the antenna with a shared radiator of the present invention, the sensing module 12 can sense the change of the parasitic capacitance generated by the radiator unit 10 so as to determine the distance between the sensing radiator unit 10 and the object. In addition, for radio frequency signals with different transmitted powers, an inductor can also be added between the sensing module 12 and the radiator unit 10 to isolate or separate the high-power high-frequency signals.

In an embodiment, a distributed capacitor structure 100 may be formed between the ground unit 13 and the radiator unit 10, as the part framed by the dashed line in FIG. 1. The single antenna with a shared radiator according to the present invention uses the distributed capacitor structure 100 to separate the high frequency signals and the low frequency signals, rather than ceramic capacitors in the prior art. The length or area of the conductor of the distributed capacitor structure 100 at the end near the radiator unit 10 is much smaller than the length or area the conductor at the end near the ground unit 13, so the electric charges would be difficult to store. Consequently, the capacitance value of the distributed capacitor structure 100 would be very small and would not affect the distance sensing capability of the sensing module 12. For example, compared with ceramic capacitors with a capacitance value of about dozens of pF in the prior art, the single antenna with a shared radiator according to the present invention can increase the sensing distance by 20% to 60%. At the same time, additional capacitors or inductors are not required, which can reduce the overall volume and cost. In addition, the distance between the radiator unit 10 and the ground unit 13 may be adjusted to adjust the capacitance value of the distributed capacitor structure 100. For example, the capacitance value of the distributed capacitor structure 100 can be fine-tuned to reduce the influence of other parasitic capacitances. In an embodiment, the radiator unit 10 may be partially surrounded by the ground unit 13 and the distributed capacitor structure 100 may be formed by and between the radiator unit10 and the ground unit 13.

Furthermore, lumped capacitor components used in the prior art would have a higher Q factor (quality factor), which will result in a narrower antenna bandwidth, while distributed capacitor structure 100 according to the present invention would have a lower Q factor, and as a result, the bandwidth would be wider.

Figure 2:
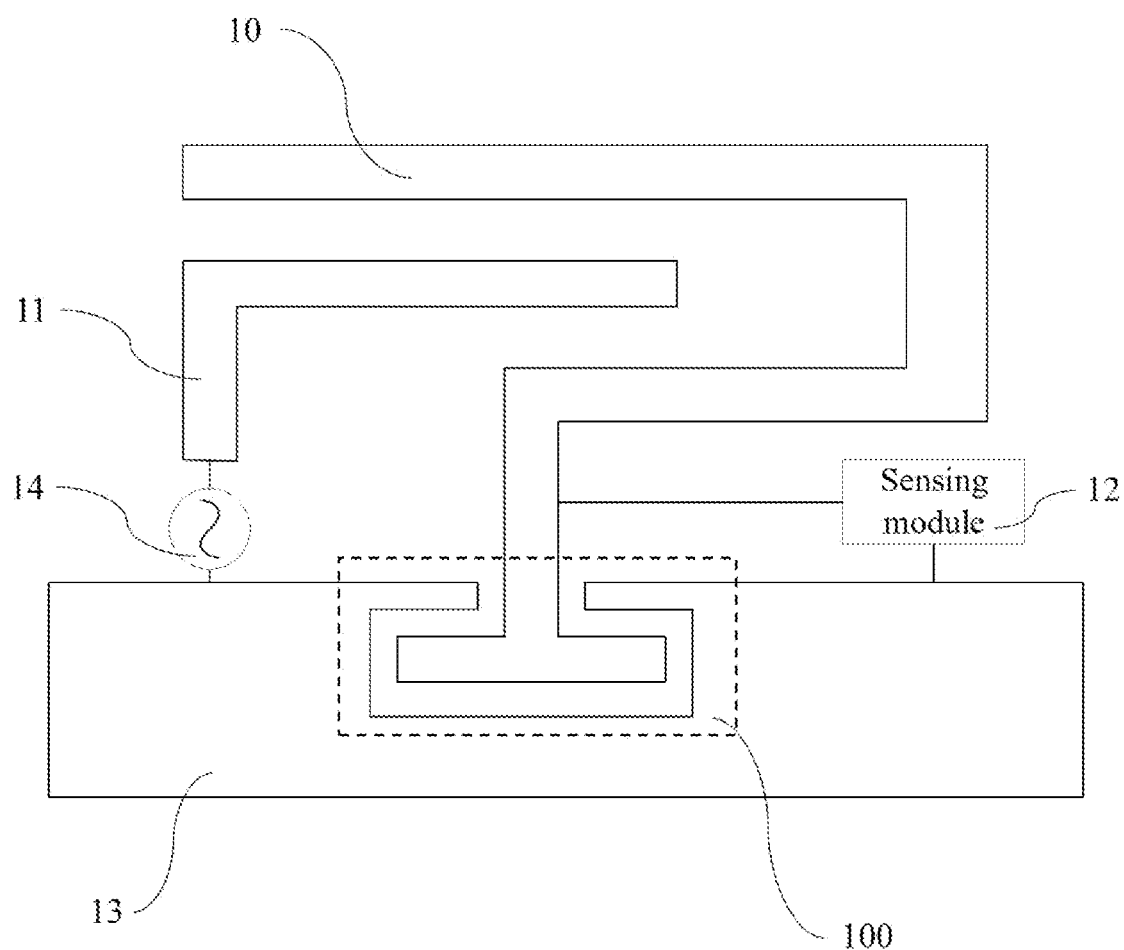
FIG. 2 illustrates a schematic view of a structure of the single antenna with a shared radiator according to a second embodiment of the present invention.

Please refer to FIG. 2. FIG. 2 illustrates a schematic view of a structure of the single antenna with a shared radiator according to a second embodiment of the present invention. In an embodiment, the single antenna with a shared radiator according to the present invention further includes a radio frequency signal module 14. The radio frequency signal module 14 is connected to the feed-in unit 11 and used to generate or receive the radio frequency signals.

In an embodiment, the sensing module 12 is further used to generate a distance signal according to the distance between the radiator unit and the object, and the radio frequency signal module 14 is further used to adjust an output power of the radio frequency signal according to the distance signal. For example, when an object (such as a human body) approaches the single antenna with a shared radiator of the present invention, the radio frequency signal module 14 would reduce the output power of the radio frequency signal to meet the requirement of the SAR test specifications.

In an embodiment, the feed-in unit 11 is a loop antenna, monopole antenna or PIFA antenna, but not limited thereto.

In an embodiment, the distributed capacitor structure 100 may be a single-layer capacitor structure, a double-layer capacitor structure, for example, providing conductors on the upper and lower layers of a substrate, or an interdigitated capacitor structure, but not limited thereto.

Figure 3:
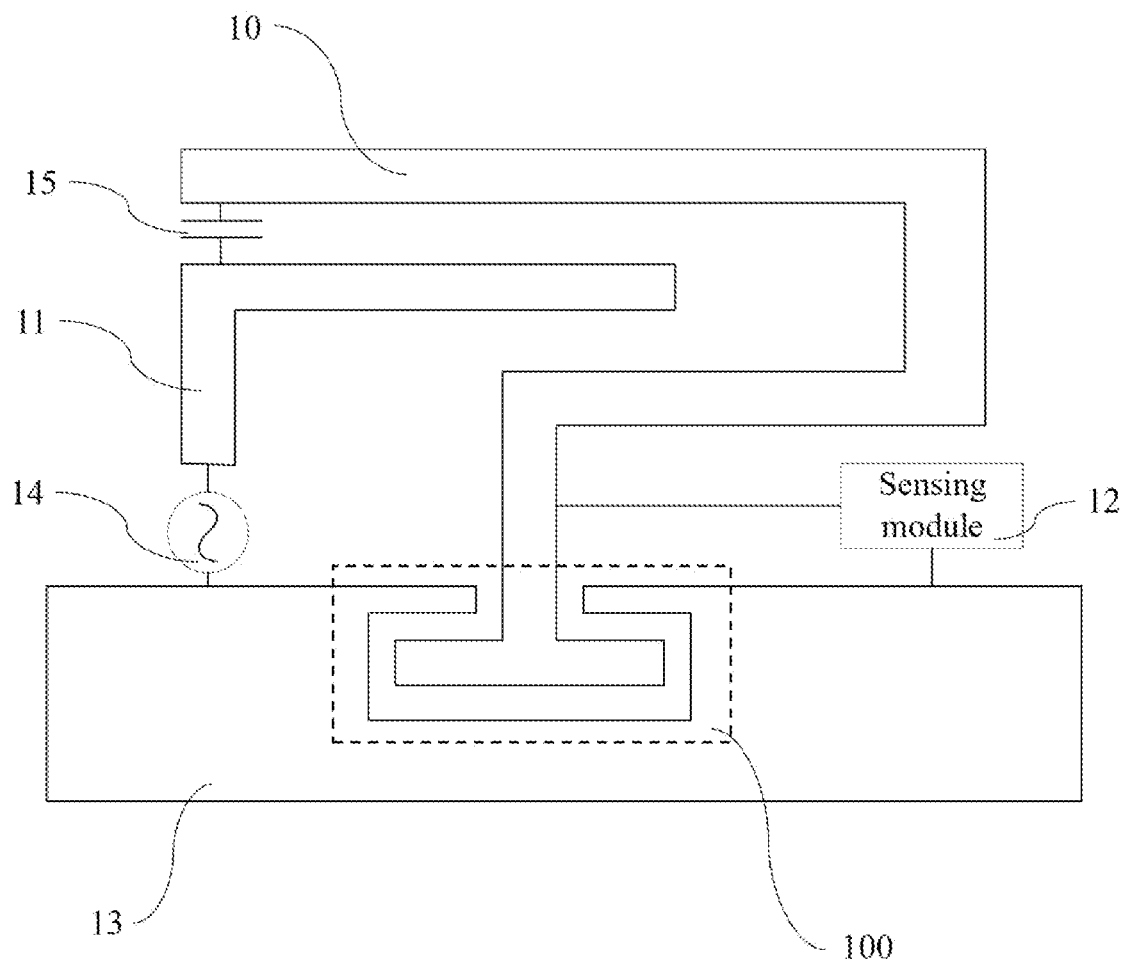
FIG. 3 illustrates a schematic view of a structure of the single antenna with a shared radiator according to a third embodiment of the present invention.

Please refer to FIG. 3. FIG. 3 illustrates a schematic view of a structure of the single antenna with a shared radiator according to a third embodiment of the present invention. In an embodiment, the single antenna with a shared radiator according to the present invention further comprises a connecting capacitor 15. One end of the connecting capacitor 15 is connected to the radiator unit 10 and the other end is connected to the feed-in unit 11. Once the connecting capacitor 15 is configured, the sensing module 12 can sense the distance between the single antenna with a shared radiator and the object by the radiator unit 10 and the feed-in unit 11. Therefore, the distance detection capability of the sensing module 12 can be improved, especially for the objects approaching from the feed-in unit 11, and the sensing range of the sensing module 12 can be further improved.

In summary, a distributed capacitor structure can be formed between a ground unit and a radiator unit in the single antenna with a shared radiator according to the present invention. The single antenna with a shared radiator can separate the high and low frequency signals. Since the length or area of the conductor of the distributed capacitor structure at the end near the radiator unit is much smaller than the length or area of the conductor of the distributed capacitor structure at the end near the ground unit, the electric charges would be difficult to store. Consequently, the capacitance value of the distributed capacitor structure would be very small and would not affect the distance sensing capability of the sensing module. The problems in the prior art are sufficiently solved. In addition, the single antenna with a shared radiator according to the present invention does not require additional capacitors or other components, which can reduce the overall volume and cost.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A single antenna with a shared radiator, comprising: a radiator unit; a feed-in unit coupled with the radiator unit and used to send or receive radio frequency signals together with the radiator unit; a sensing module connected between the radiator unit and a ground unit, used for sensing a distance between the radiator unit and an object by the radiator unit; and the ground unit, wherein a distributed capacitor structure is formed between the ground unit and the radiator unit, wherein the distributed capacitor structure is formed by one end of the ground unit and one end of the radiator unit, wherein a first plate of the distributed capacitor structure is the ground unit, a second plate of the distributed capacitor structure is the radiator unit, wherein an area fully bounded by the second plate of the distributed capacitor structure is smaller than an area fully bounded by the first plate of the distributed capacitor structure, and wherein the second plate of the distributed capacitor structure is surrounded on at least three sides by the first plate of the distributed capacitor structure.

2. The single antenna with a shared radiator of claim 1, further comprising:
a radio frequency signal module connected to the feed-in unit and used to generate or receive the radio frequency signals.

3. The single antenna with a shared radiator of claim 2, wherein the sensing module is further used to generate a distance signal according to the distance between the radiator unit and the object, and the radio frequency signal module is further used to adjust an output power of the radio frequency signal according to the distance signal.

4. The single antenna with a shared radiator of claim 1, wherein the feed-in unit is a loop antenna, monopole antenna or PIFA antenna.

5. The single antenna with a shared radiator of claim 1, wherein the distributed capacitor structure is a single-layer capacitor structure, a double-layer capacitor structure or an interdigitated capacitor structure.

6. The single antenna with a shared radiator of claim 1, further comprising:
a connecting capacitor wherein one end of the connecting capacitor is connected to the radiator unit and the other end is connected to the feed-in unit.

* * * * *